US005665515A

United States Patent [19]

Deprez et al.

[11] Patent Number: 5,665,515
[45] Date of Patent: Sep. 9, 1997

[54] METHOD FOR OBTAINING A PRINTING PLATE ACCORDING TO THE SILVER SALT DIFFUSION TRANSFER PROCESS

[75] Inventors: Lode Deprez, Wachtebeke; Marcel Monbaliu, Mortsel; Jean-Marie Dewanckele, Drongen, all of Belgium

[73] Assignee: Agfa-Gevaert N.V., Mortsel, Belgium

[21] Appl. No.: 544,662

[22] Filed: Oct. 18, 1995

[30] Foreign Application Priority Data

Oct. 24, 1994 [EP]  European Pat. Off. ......... 942 03 061.0

[51] Int. Cl.$^6$ .............................. G03C 8/44; G03C 8/36; G03C 8/32; G03F 7/07
[52] U.S. Cl. .............................. 430/204; 430/248; 430/207
[58] Field of Search .............................. 430/204, 248, 430/207

[56] References Cited

U.S. PATENT DOCUMENTS

| 3,776,728 | 12/1973 | Suzuki et al. ........................ | 96/29 |
|---|---|---|---|
| 4,062,682 | 12/1977 | Laridon et al. ........................ | 430/204 |
| 4,563,410 | 1/1986 | De Jaeger et al. ........................ | 430/204 |
| 5,118,853 | 6/1992 | Kondo et al. ........................ | 430/204 |
| 5,432,042 | 7/1995 | Deprez et al. ........................ | 430/204 |

FOREIGN PATENT DOCUMENTS

| 0503164 | 9/1992 | European Pat. Off. . |
|---|---|---|
| 0554585 | 8/1993 | European Pat. Off. . |
| 0569068 | 11/1993 | European Pat. Off. . |
| 1373415 | 11/1974 | United Kingdom . |

*Primary Examiner*—Richard L. Schilling
*Attorney, Agent, or Firm*—Brumbaugh, Graves, Donohue & Raymond

[57] ABSTRACT

The present invention provides a method for making a lithographic printing plate according to the silver salt diffusion transfer process using a photographic material comprising on a support a silver halide emulsion layer and a layer containing physical development nuclei comprising the steps of:

image-wise exposing said photographic material;

developing a thus obtained image-wise exposed photographic material by guiding said image-wise exposed photographic material through an alkaline processing liquid comprising a hydrophobizing agent, in 15s or less and subsequently guiding a thus obtained developed photographic material through a stabilizing liquid;

characterized in that said stabilizing liquid comprises a compound having a mercapto-group having a $pK_a$ of 4.5 or less.

6 Claims, No Drawings

METHOD FOR OBTAINING A PRINTING PLATE ACCORDING TO THE SILVER SALT DIFFUSION TRANSFER PROCESS

FIELD OF THE INVENTION

The present invention relates to a method for making a lithographic printing plate according to the silver salt diffusion transfer process.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. A particular interesting type of photographic material for making a printing plate according to the DTR-process comprises in the order given on a support a silver halide emulsion layer and a physical development nuclei containing layer as a surface layer. Such type of photographic material is commercially available under the tradename of SUPERMASTER from Agfa-Gevaert NV and from Mitsubishi Paper Mills under the tradename SILVERMASTER.

These commercial printing plates are generally processed by means of camera plate makers that include an exposure unit as well as a developing unit. As a result of a demand on the market to reduce the time needed for producing a printing plate, the processing times in such camera plate makers have been shorted.

In particular the time that lapses between entrance of the photographic material into the developing liquid and exit of the photographic material out of the developing liquid is substantially reduced. Typically the time has been reduced to less than 15s and may even be less than 10s.

It has now been found by us that the automatic processing of a photographic material according to the DTR-process in a camera plate maker that uses short development times of 15s or less, results in printing plates of inferior quality. In particular, it was found that when the plates were stored for some time after plate-making but before actual printing, the printing endurance was much less than in case the printing plate was used to print immediately after plate-making.

SUMMARY OF THE INVENTION

It is an object of the present invention to provide a method for making a printing plate according to the silver salt diffusion transfer process with reduced dipping times into the developing liquid and which printing plate can be stored without substantial loss of the printing quality such as printing endurance and ink-acceptance.

Further objects of the present invention will become clear from the description hereinafter.

According to the present invention there is provided a method for making a lithographic printing plate according to the silver salt diffusion transfer process using a photographic material comprising on a support a silver halide emulsion layer and a layer containing physical development nuclei comprising the steps of:

image-wise exposing said photographic material;

developing a thus obtained image-wise exposed photographic material by guiding said image-wise exposed photographic material through an alkaline processing liquid comprising a hydrophobizing agent, in 15s or less and subsequently guiding a thus obtained developed photographic material through a stabilising liquid;

characterised in that said stabilising liquid comprises a compound having a mercapto-group having a $pK_a$ of 4.5 or less.

DETAILED DESCRIPTION

According to the present invention it has been found that the problems of loss of printing quality during storage of a printing plate obtained according to the DTR-process using short dipping times can be overcome by using a stabilising liquid that comprises a compound having a mercapto-group having a $pK_a$ of 4.5 or less. It is essential to the present invention that a compound be used that has a mercapto-group of $pK_a$-value of 4.5 or less. When using a compound having only a mercapto-group of $pK_a$-value of more than 4.5, the printing endurance of the plate during storage may be kept but in that case it is observed that the ink-acceptance of the plate decreases resulting in a much more copies that have to be disposed of during start-up of the print job.

Using a stabilising liquid in accordance with the present invention even allows dipping times of 10s or less.

The $pK_a$ of the mercapto-compounds in connection with the present invention were determined according to the method described in "Ionization Constants of Acids and Bases—A Laboratory Manual" written by Adrien Albert and E. P. Serjeant and Edited by John Wiley & Sons (New York) page 110–112 (1962).

In these particular cases, the compounds were dissolved in water at pH 11. The concentration of the compounds was 0.002 mole/liter and the mixture was then titrated with a solution of hydrochloric acid (0.1 mole/liter).

Mercapto-compounds that are suitable for use in connection with the present invention are compounds having a mercapto group with a $pK_a$ of 4.5 or less, preferably of a $pK_a$ of 4 or less, more preferably 3.7 or less and that are preferably substituted with a group containing at least 3 carbons and more preferably at least 5 carbon atoms. Preferably the compounds are heterocyclic compounds containing the mercapto group on the heterocyclic ring. In a highly preferred embodiment in connection with the present invention, the mercapto-compounds are hydrophobizing agents capable of improving the ink-acceptance of the silver image.

Particularly preferred compounds for use in connection with the present invention correspond to the following formula (I):

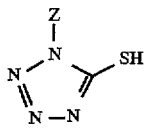

wherein Z represents a substituted or unsubstituted alkyl, a substituted or unsubstituted aryl, an aralkyl, an alkylaryl, a substituted or unsubstituted alkenyl, a substituted or unsubstituted alkynyl or a heterocyclic ring.

Specific examples of compounds according to formula (I) are listed in table 1.

TABLE 1

| compound no. | Z in formula (I) | $pK_a$ |
|---|---|---|
| 1 | $CH_2CONH$-n.$C_6H_{13}$ | 3.3 |
| 2 | $CH_2CON(n.C_4H_9)_2$ | 3.3 |
| 3 | n.$C_6H_{13}$ | 3.4 |
| 4 | n.$C_8H_{17}$ | 3.4 |
| 5 | n.$C_4H_9$ | 3.2 |
| 6 | $C_6H_5$ | 3.1 |

According to the present invention the mercapto-compounds may be contained in the stabilising liquid in an amount of at least $10^{-4}$ mol/l, more preferably at least $10^{-3}$ mol/l. The maximum amount of the mercapto-compound will be determined by the type of compound, type and amount of silver halide solvents etc. Typically the concentration of mercapto-compound is preferably not more than $10^{-1}$ mol/l.

The stabilising liquid generally has a pH between 5 and 7. The stabilising liquid preferably contains a buffer e.g. a phosphate buffer, a citrate buffer or mixture thereof and preferably an alkanol amine such as the alkanol amines listed furtheron. The buffer capacity of the stabilising liquid is preferably such that the addition of 0.5 ml of a 1 molar aqueous sodium hydroxide solution to 50 ml of stabilising liquid does not increase the pH of the stabilising above 6.5. The stabilising liquid can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Further the stabilising liquid can contain wetting agents, e.g. pluronic and preferably compounds (wetting agents) containing perfluorinated alkyl groups.

The hydrophobizing agents for use in the alkaline processing liquid are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl containing at least 3 carbon atoms. Examples of hydrophobizing agents for use in accordance with the present invention are e.g. those described in U.S. Pat. Nos. 3,776,728, and 4,563,410. Preferred compounds correspond to one of the following formulas or correspond to formula (I) shown above:

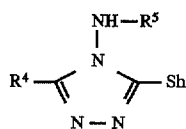

R⁴O Sh
(III)

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

According to a preferred embodiment the alkaline processing solution also contains a meso ionic compound. Meso-ionic compounds as referred to in the present invention are a group of compounds defined by W. Baker and W. D. Ollis as "5- or 6-membered heterocyclic compounds which cannot be represented satisfactorily by any one covalent or polar structure and possesses a sextet of π-electrons in association with the atoms comprising the ring. The ring bears a fractional positive charge balanced by a corresponding negative charge located on a covalently attached atom or group of atoms" as described in Quart. Rev., Vol. 11, p. 15 (1957) and Advances in Heterocyclic Chemistry, Vol. 19, P. 4 (1976).

Preferred meso-ionic compounds are those represented by formula (IV):

$$M^+ \quad A^- \quad \text{(IV)}$$

wherein M represents a 5- or 6-membered heterocyclic ring composed of at least one member selected from the group consisting of a carbon atom, a nitrogen atom, an oxygen atom, a sulfur atom and a selenium atom; and $A^-$ represents —O⁻, —S⁻ or —N⁻—R, wherein R represents an alkyl group (preferably having 1 to 6 carbon atoms), a cycloalkyl group (preferably having 3 to 6 carbon atoms), an alkenyl group (preferably having 2 to 6 carbon atoms) an alkynyl group (preferably having 2 to 6 carbon atoms), an aralkyl group, an aryl group (preferably having 6 to 12 carbon atoms), or a heterocyclic group (preferably having 1 to 6 carbon atoms).

In formula (IV), examples of the 5-membered heterocyclic ring as represented by M include an imidazolium ring, a pyrazolium ring, an oxazolium ring, an isoxazolium ring, a thiazolium ring, an isothiazolium ring, a 1,3-dithiol ring, a 1,3,4- or 1,2,3-oxadiazolium ring, a 1,3,2-oxathiazolium ring, a 1,2,3-triazolium ring, a 1,3,4-triazolium ring, a 1,3,4-, 1,2,3- or 1,2,4-thiadiazolium ring, a 1,2,3,4-oxatriazolium ring, a 1,2,3,4-tetrazolium ring and a 1,2,3,4-thiatriazolium ring.

Preferred meso-ionic compounds for use in accordance with the present invention are triazolium thiolates and more preferably 1,2,4-triazolium-3-thiolates and most preferably those that correspond to the following formula:

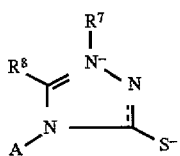
(VI)

wherein $R^7$ and $R^8$ each independently represents an unsubstituted or substituted alkyl group, alkenyl group, cycloalkyl group, aralkyl group, aryl group or heterocyclic group, A represents an unsubstituted or substituted alkyl group, alkenyl group, cycloalkyl group, aralkyl group, aryl group, heterocyclic group or —$NR^9R^{10}$ wherein $R^9$ and $R^{10}$ each independently represents hydrogen, an alkyl group or aryl group or $R^7$ and $R^8$ or $R^8$ and A or $R^9$ and $R^{10}$ represent the necessary atoms to form a 5- or 6-membered ring.

Specific examples of 1,2,4-triazolium-3-thiolates suitable for use in accordance with the present invention are shown in table 2.

TABLE 2

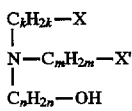

TABLE 2-continued

Preferably the amount of meso-ionic compound in the alkaline processing liquid is between 0.1 mmol/l and 50 mmol/l and more preferably between 0.1 mmol/l and 25 mmol/l and most preferably between 0.5 mmol/l and 10 mmol/l.

Preferably, the alkaline processing solution also contains an alkanolamine. Alkanolamines that are suitable for use in accordance with the present invention may be of the tertiary, secondary or primary type. Examples of alkanolamines that may be used in connection with the present invention correspond to the following formula:

$$\begin{array}{c} C_kH_{2k}\!-\!X \\ | \\ N\!-\!C_mH_{2m}\!-\!X' \\ | \\ C_nH_{2n}\!-\!OH \end{array}$$

wherein X and X' independently represent hydrogen, a hydroxyl group or an amino group, k and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

The alkanolamines are preferably used in a concentration of 0.05% to 10% by weight and more preferably in a concentration of 0.05% by weight to 7% by weight.

In addition to the hydrophobizing compound and optionally a meso-ionic compound and/or an alkanolamine the alkaline processing liquid can further comprise silver halide solvents. Additional silver halide solvents for use in connection with the present invention are e.g. 2-mercaptobenzoic acid, cyclic imides, oxazolidones, thiocyanates, thioethers and thiosulfates, polyamines e.g. ethylene diamine, n-propylene diamine, n-butylene diamine or such polyamines as disclosed in Japanese Laid-Open patent publication no. 06-222560.

Preferably used thioethers correspond to the following general formula:

$$Z-(R^1-S)_t-R^2-S-R^3-Y$$

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10.

Examples of thioether compounds corresponding to the above formula are disclosed in e.g. U.S. Pat. No. 4,960,683 and specific examples are listed in table 3.

TABLE 3

| | |
|---|---|
| $(HO-CH_2-CH_2)_2S$ | 1 |
| $HO-CH_2-CH_2-S-CH_2-S-CH_2-CH_2-OH$ | 2 |
| $HO-CH_2-CH_2-S-(CH_2)_2-S-CH_2-CH_2-OH$ | 3 |
| $HO-CH_2-CH_2-S-(CH_2)_3-S-CH_2-CH_2-OH$ | 4 |
| $HO-CH_2-CH_2-S-(CH_2)_4-S-CH_2-CH_2-OH$ | 5 |
| $C_2H_5-S-CH_2-CH_2-S-CH_2-CHOH-CH_2-OH$ | 6 |
| $(HOCH_2-CH_2-S-CH_2-CH_2)_2O$ | 7 |
| $HO-CH_2-CH_2-S-CH_2-CH_2-N(CH_3)_2$ | 8 |
| $(HO-CH_2-CHOH-CH_2-S-CH_2)_2$ | 9 |
| $HOOC-CH_2-S-CH_2-S-CH_2-COOH$ | 10 |
| $HOOC-CH_2-S-(CH_2)_2-S-CH_2-COOH$ | 11 |
| $HOOC-CH_2-S-(CH_2)_3-S-CH_2-COOH$ | 12 |
| $HOOC-(CH_2)_2-S-CH_2-S-(CH_2)_2-COOH$ | 13 |
| $HOOC-(CH_2)_2-S-(CH_2)_2-S-(CH_2)_2-COOH$ | 14 |
| $HOOC-(CH_2)_2-S-(CH_2)_3-S-(CH_2)_2-COOH$ | 15 |
| $CH_3-S-CH_2-CH_2-\underset{\underset{NH_2}{\mid}}{CH}-COOH$ | 16 |

Preferably the silver halide solvent is used in an amount between 0.05% by weight and 10% by weight and more preferably between 0.05% by weight and 7% by weight.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent. The present invention allows the use of alkaline processing liquids of low pH (11 or less) to be used. This is a further advantage of the present invention because such liquids are less corrosive and less susceptible to exhaustion.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are e.g. ascorbic acid, of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. Preferred phenidone type developing agents, particularly when they are incorporated into the photographic material are phenidones of which the aqueous solubility is increased by a hydrophilic substituent such as e.g. hydroxy, amino, carboxylic acid group, sulphonic acid group etc. Examples of phenidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

At least the auxiliary developing agents are preferably incorporated into the photographic material. The auxiliary developing agent is preferably incorporated in the photographic material, preferably in the silver halide emulsion layer of the photographic material, in an amount of less than 150 mg/g of silver halide expressed as $AgNO_3$, more preferably in an amount of less than 100 mg/g of silver halide expressed as $AgNO_3$.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805—4,038,075—4,292,400— 4,975,354.

Shortly before printing the plate may be wiped with a so-called etch solution. Conveniently this etch solution has a composition similar to the stabilising liquid.

The image-wise exposure in connection with the present invention may be a camera exposure but may also be a scan-wise exposure e.g. by means of a laser or LED.

A photographic material for use in connection with the method of the present invention comprises on a support in the order given a silver halide emulsion layer and a layer containing physical development nuclei.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly (ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The image receiving layer containing physical development nuclei is preferably free of hydrophilic binder but may comprise small amounts upto 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide may be present ranging from 1 mole % to 40 mole %. Most preferably the amount of bromide is kept below 5 mole %. The emulsions may further contain silver iodide in an amount of upto 5 mole % preferably upto 2 mole %.

The average size of the silver halide grains may range from 0.10 to 0.70 µm, preferably from 0.25 to 0.45 µm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or pentaazaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivativesas disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

In an especially preferred embodiment the emulsion layer contained in the imaging element contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g. Product Licensing Index, Vol. 92, December 1971, publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivety, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the theological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, methylenebis (sulfonylethylene), chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3, 5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group: ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth) acrylates, sulphoalkyl (meth)acrylates, and styrene sulphonic acids.

According to another embodiment of the present invention a lithographic printing plate can be obtained by means of the DTR-process using an imaging element comprising in the order given a grained and anodized aluminium support, an optional layer of physical development nuclei and a silver halide emulsion layer. The imaging element of the present embodiment may be imaged using a camera-exposure or a scanning exposure as described above followed by a development step in the presence of development agent(s) and silver halide solvent(s) so that a silver image is formed in the physical development nuclei layer or directly on the aluminium support. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents as described above.

The present invention will now be illustrated by way of the following examples without however the intention to limit the invention thereto. All parts are by weight unless otherwise specified.

EXAMPLE

Preparation of the silver halide emulsion coating solution.

A silver chlorobromide emulsion composed of 98.2 mole % of chloride and 1.8 mole % of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercaptotetrazole and a compound of the following formula:

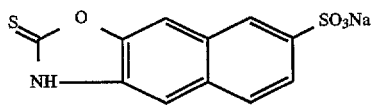

A base layer coating solution was prepared having the following composition:

| gelatin | 5.5% |
|---|---|
| carbon black | 0.76% |
| silica particles (5 μm) | 1.6% |

Preparation of the imaging element:

The emulsion coating solution and base layer coating solution were simultaneously coated by means of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 g/m² and the gelatin content was 1.5 g/m². The emulsion layer further contained 0.15 g/m² of 1-phenyl-4-methyl-3-pyrazolidone and 0.25 g/m² of hydroquinone. The base layer was coated such that the amount of gelatin in the coated layer was 3 g/m².

The layer nearest to the support of the backing layer pack contained 0.3 g/m² of gelatin and 0.5 g/m² of the antistatic agent co(tetraallyloxyethane/methacrylate/acrylic acid-K-salt) polymer. The second backing layer contained 4 g/m² of gelatin, 0.15 g/m² of a matting agent consisting of transparent spherical polymeric beads of 3 micron average diameter according to EP 0080225, 0.05 g/m² of hardening agent triacrylformal and 0.021 g/m² of wetting agent $F_{15}C_7$—COONH₄.

The thus obtained element was dried and subjected to a temperature of 40° C. for 5 days and then the emulsion layer was overcoated with a layer containing PdS as physical development nuclei, hydroquinone at 0.4 g/m² and formaldehyde at 100 mg/m².

The following processing solutions were prepared:

| Transfer developer | |
|---|---|
| sodium hydroxide (g) | 30 |
| sodium sulphite anh. (g) | 35 |
| compound no 9 of table 2 (g) | 1.2 |
| 2-mercapto-5-n.heptyl-oxa-3,4-diazole (mg) | 350 |
| EDTA sodium salt (g) | 1 |
| amino-ethyl-amino-ethanol (ml) | 40 |
| methylhydroquinone (g) | 2 |
| water to make | 1 liter |
| Stabilising liquid | |
| sodium dihydrogenphosphate.H₂O | 40 g |
| tri-ethanolamine | 10 g |
| pluronic | 50 mg |
| mercapto-compound | (see table 4) |
| water to make | 1 l |

Imaging elements prepared as described above were image-wise exposed using a camera and were subsequently developed by guiding the imaging element through the above transfer developer in 20s, 13s or 5s at a temperature of 30° C. The obtained plates were subsequently stabilised using the above stabilising liquid.

The obtained printing plates were then mounted on an offset press GTO 46 running a K+E 125 ink and a fountain liquid containing 5% of G648 (commercially available from Agfa-Gevaert NV) and 15% of isopropanol. The results obtained were as follows:

TABLE 4

| mercapto-compound no. (table 1) | amount (mmol/l) | developing time (s) | printing endurance fresh | printing endurance 7 days | ink accept.* |
|---|---|---|---|---|---|
| — | — | 5 | >10000 | <1000 | <25 |
| — | — | 13 | >10000 | <1000 | <25 |
| — | — | 20 | >10000 | >10000 | <25 |
| C | 2 | 5 | >10000 | >10000 | 25–50 |
| C | 2 | 13 | >10000 | >10000 | 25–50 |
| 6 | 2.4 | 5 | >10000 | >10000 | 25–35 |
| 6 | 2.4 | 13 | >10000 | >10000 | 25–35 |
| 2 | 1.5 | 5 | >10000 | >10000 | <25 |
| 2 | 1.5 | 13 | >10000 | >10000 | <25 |
| 2/6 | 2.4/1.5 | 5 | >10000 | >10000 | <25 |
| 2/6 | 2.4/1.5 | 13 | >10000 | >10000 | <25 |
| 3 | 0.9 | 5 | >10000 | >10000 | <25 |
| 3 | 0.9 | 13 | >10000 | >10000 | <25 |
| 4 | 2.7 | 5 | >10000 | >10000 | <25 |
| 4 | 2.7 | 13 | >10000 | >10000 | <25 |

*the ink acceptance is evaluated as the number of copies that have to be disposed of before a satisfactory print is obtained.
mercapto-compound C = 2-mercapto-5-n.heptyl-oxa-3,4-diazole (pK$_a$ = 4.8)

We claim:

1. A method for making a lithographic printing plate according to the silver salt diffusion transfer process using a photographic material comprising on a support a silver halide emulsion layer and a layer containing physical development nuclei comprising the steps of:

image-wise exposing said photographic material;

developing a thus obtained image-wise exposed photographic material by guiding said image-wise exposed photographic material through an alkaline processing liquid comprising a hydrophobizing agent, in 15s or less and;

directly thereafter guiding a thus obtained developed photographic material through a stabilising liquid wherein said stabilising liquid has a pH of from 5 to 7 and comprises a buffer;

characterized in that said stabilising liquid comprises a compound having a mercapto-group having a pH$_a$ of 4.5 or less and corresponding to the following formula:

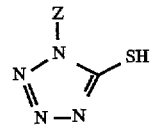

(I)

wherein Z represents an alkyl, an aryl, an alkenyl, an alkynyl or a heterocyclic ring.

2. A method according to claim 1 wherein said image-wise exposed photographic material is guided through said alkaline processing liquid in 10s or less.

3. A method according to claim 1 wherein the alkaline processing solution further contains a meso-ionic compound.

4. A method according to claim 3 wherein said alkaline processing solution further contains an alkanolamine.

5. A method according to claim 3 wherein said meso-ionic compound is a triazolium thiolate.

6. A method according to claim 1 wherein said compound having a mercapto-group having a pK$_a$ of 4.5 or less is a hydrophobizing compound.

* * * * *